US00RE41355E

(19) United States
(12) Reissued Patent
Sabin et al.

(10) Patent Number: US RE41,355 E
(45) Date of Reissued Patent: May 25, 2010

(54) METHOD FOR PLACING ACTIVE CIRCUITS BENEATH ACTIVE BONDING PADS

(75) Inventors: Gregory D. Sabin, San Mateo, CA (US); William J. Gross, Chandler, AZ (US); Jung-Yueh Chang, Tempe, AZ (US)

(73) Assignee: Intel Corporation, Santa Clara, CA (US)

(21) Appl. No.: 11/429,635

(22) Filed: May 5, 2006

Related U.S. Patent Documents

Reissue of:
(64) Patent No.: 6,734,093
Issued: May 11, 2004
Appl. No.: 09/271,615
Filed: Mar. 17, 1999

(51) Int. Cl.

| | |
|---|---|
| ***H01L 23/053*** | (2006.01) |
| ***H01L 23/48*** | (2006.01) |
| ***H01L 21/44*** | (2006.01) |
| ***H01L 21/4763*** | (2006.01) |
| ***H01L 23/52*** | (2006.01) |
| ***H01L 29/40*** | (2006.01) |

(52) U.S. Cl. ..... 438/614; 257/786; 257/784; 257/737; 257/773; 257/781; 257/E23.019; 257/E23.142; 257/E23.145; 257/758; 438/612; 438/613; 438/617; 438/615; 438/622

(58) Field of Classification Search ..... 257/758, 257/700, 773, 786, 781; 438/612, 613, 618, 438/622, 625
See application file for complete search history.

(56) References Cited

U.S. PATENT DOCUMENTS

| | | | | |
|---|---|---|---|---|
| 4,723,197 | A | | 2/1988 | Takiar et al. |
| 4,949,150 | A | | 8/1990 | Giannella et al. |
| 5,084,752 | A | | 1/1992 | Satoh et al. |
| 5,357,672 | A | * | 10/1994 | Newman ..... 29/830 |
| 5,719,448 | A | | 2/1998 | Ichikawa et al. |
| 5,734,200 | A | | 3/1998 | Hsue et al. |
| 5,821,587 | A | * | 10/1998 | Jeong ..... 257/355 |
| 5,869,869 | A | * | 2/1999 | Hively ..... 257/355 |
| 5,986,343 | A | | 11/1999 | Chittipeddi et al. |
| 6,025,631 | A | | 2/2000 | Lin |
| 6,031,293 | A | | 2/2000 | Hsuan et al. |
| 6,043,144 | A | | 3/2000 | Kuo et al. |
| 6,054,334 | A | * | 4/2000 | Ma ..... 438/14 |
| 6,146,985 | A | * | 11/2000 | Wollesen ..... 438/618 |
| 6,147,857 | A | * | 11/2000 | Worley et al. ..... 361/301.2 |
| 6,150,725 | A | * | 11/2000 | Misawa et al. ..... 257/781 |
| 6,313,537 | B1 | * | 11/2001 | Lee et al. ..... 257/758 |
| 6,476,459 | B2 | | 11/2002 | Lee |
| 6,794,752 | B2 | | 9/2004 | Lee et al. |
| 6,798,035 | B1 | | 9/2004 | Low et al. |

* cited by examiner

*Primary Examiner*—Hsien-ming Lee
(74) *Attorney, Agent, or Firm*—Blakely, Sokoloff, Taylor & Zafman LLP

(57) ABSTRACT

The present invention provides a bonding pad structure for integrated circuit devices which allows the active circuits to be placed under bonding pads of the device without affecting the performance of the active circuits. The bonding pad structure is composed of at least two metal layers overlying the active circuits so that the bonding pad may be subjected to thermal and mechanical stresses without damaging the underlying active circuits. The metal layer underlying the bonding pad is patterned and etched forming an array of openings in the metal that may take any shape, e.g. slots, grid, circles. The present invention enables a reduction in the chip area and eliminates the parasitic resistance due to long interconnection wires between bonding pads and active regions.

61 Claims, 3 Drawing Sheets

METHOD FOR PLACING ACTIVE CIRCUITS BENEATH ACTIVE BONDING PADS

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates to the field of integrated circuit devices, and more specifically, to the design of a bonding pad structure for such devices.

2. Background Information

Integrated circuit chips (dice) are manufactured by fabricating a plurality of identical circuits on a semiconductor wafer, scribing the wafer between the circuits, and subsequently breaking apart the wafer into individual chips. The chips are then mounted on lead frames or substrates for packaging and wire bonded for chip external connections. The bonding wire connects the bonding pads on the chip with the lead frame. IC chips can be bonded using thermocompression or ultrasonic techniques. In thermocompression bonding, heat and pressure are applied to the pad and to the underlying substrate in order to achieve the bond. In ultrasonic bonding, sufficient energy is supplied by ultrasonic vibration to achieve the bond.

Active circuit elements, including transistors, resistors, capacitors, inductors, and the like, are generally located in the central portion of the semiconductor device, while bonding pads have been located around the periphery of the active region on the chip. Bonding pads are generally not located above the active circuits in order to protect the active circuit elements during bonding processes.

In many instances, it may be desirable to place active circuits beneath the bonding pads. For example, it may advantageous to place active circuits under bonding pads in order to decrease die area and to reduce parasitic resistance due to long interconnection wires between bonding pads and active regions. However, due to thermal and mechanical stresses occurring during the bonding process, the underlying circuits may become damaged. For example, as the wire and the die are heated during the process of connecting the wire to the bonding pad, the bonding wire is pressed onto the bonding pad. Additional energy may be supplied by ultrasonic vibration in order to form the bond. When pressure or vibration is exerted upon the bonding pad, the bonding pad can be perforated and the underlying circuits may crack which degrades device performance.

Therefore, what is needed is a method for fabricating a bonding pad structure which allows the placement of active circuits beneath a bonding pad, without damaging or otherwise affecting the performance of the active circuits, and a method that enables the manufacture of semiconductor devices with smaller die sizes.

SUMMARY OF THE INVENTION

A method for forming a bonding pad structure over an active circuit of an integrated circuit device is disclosed. A plurality of metal layers are deposited over the active circuit. The uppermost metal layer is patterned and etched to form an array of openings in the metal layer. A dielectric layer is deposited over the uppermost metal layer and over the array of openings in the metal layer. A bonding pad is formed over the dielectric layer.

Additional features and benefits of the present invention will become apparent from the detailed description, figures, and claims set forth below.

BRIEF DESCRIPTION OF THE DRAWINGS

The present invention is illustrated by way of example and not limitation in the accompanying figures in which.

DETAILED DESCRIPTION

A method for placing active circuits beneath bonding pads of an IC device is disclosed. In the following description, numerous specific details are set forth such as specific materials, methods, etc., in order to provide a thorough understanding of the present invention. It will be obvious, however, to one skilled in the art that these specific details may not be needed in order to practice the present invention. In other instances, well-known processing steps have not been described in detail in order to avoid unnecessarily obscuring the present invention.

The present invention is a method for forming a bonding pad structure for integrated circuit devices which allows active circuits to be placed under bonding pads of the device. The bonding pad of the present invention is able to protect the underlying active circuits from shear and compressive stresses occurring during bonding processes. Thus, the die area that would otherwise be reserved just for bonding pads can now be used for active circuits. Additionally, using the present invention, the bonding pads may not necessarily have to be located on the outer edge of the chip.

Figure 1:
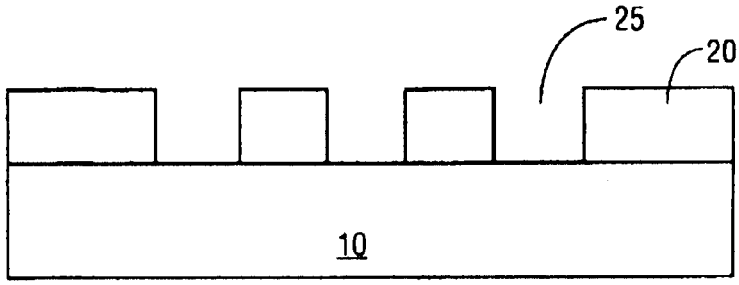
FIG. 1 is a sectional view of an integrated circuit illustrating a patterned metal layer above the active region of the device.

FIG. 1 illustrates the underlying structure over which a bonding pad may be formed. The underlying structure is composed of a substrate (not shown) on which active circuits 10 is formed. A metal layer 20 is deposited over active circuits 10 of the device. The metal layer 20 is then patterned and etched in order to form an array of openings or grooves 25 in the metal layer 20. The grooves 25 in the metal layer 20 may take any polygonal shape, e.g. rectangle, square, circle, triangle, etc. and they may form any shape in the metal layer such as a grid, waffle, slots, etc. For example purposes, FIGS. 1–4 illustrate the metal array 20 with openings in the metal taking the shape of slots 25.

Figure 2:
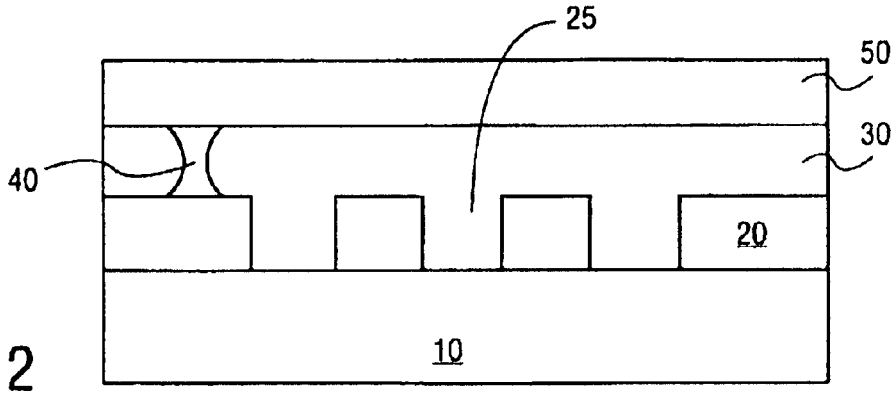
FIG. 2 is a sectional view of an integrated circuit illustrating the bonding pad structure according to the present invention.

Referring to FIG. 2, an insulating layer, for example dielectric layer 30, is then deposited over metal array 20. The dielectric layer 30 electrically isolates the metal array 20 from the pad. Additionally, dielectric layer 30 helps absorb compressive stress and insulates from thermal stress during the bonding process. In one embodiment of the present invention dielectric layer 30 consists of silicon dioxide.

Next, dielectric layer 30 is etched to form vias 40. Vias 40 provide for electrical coupling between active circuits 10 and bonding pad 50. In one embodiment of the present invention, vias 40 are formed on the edges of bonding pad 50. Bonding pad 50 is formed by depositing a metal layer over dielectric layer 30 such that the active circuits 10 are placed as much as possible in the center of the bonding pad 50.

Figure 3:
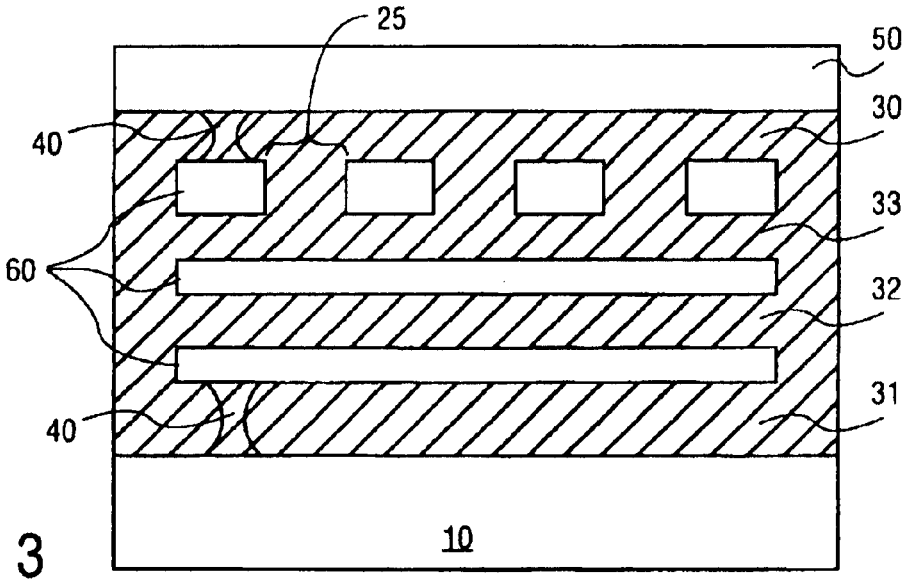
FIG. 3 illustrates the bonding pad structure according to one embodiment of the present invention.

In one embodiment of the present invention, there are several metal layers deposited over active circuits 10. As illustrated in FIG. 3, an insulating layer 31 is deposited over the active circuits 10. Metal layers 60 are then deposited over the insulating layer 31. The uppermost metal layer is then patterned and etched to form the metal openings or slots 25. It should be noted that, for simplicity, vias interconnecting all the metal layers in FIG. 3 are not shown. The insulating layers 30, 31, 32, and 33 are etched to form vias 40 which provide for electrical coupling between active circuits 10 and bonding pads 50. The insulating layers 31, 32, and 33 electrically isolate the metal layers 60 and help absorb compressive and thermal stresses during the bonding process. The plurality of metal layers provide for extra absorption of mechanical shock.

It should be noted that any of a number of materials may be used to form both the metal layers and the bonding pad. For example, aluminum, aluminum alloys, copper, copper alloys, gold, gold alloys, polysilicon, silicon alloys, or any combination thereof may be used to form the bonding pad and the underlying metal layers.

Figure 4:
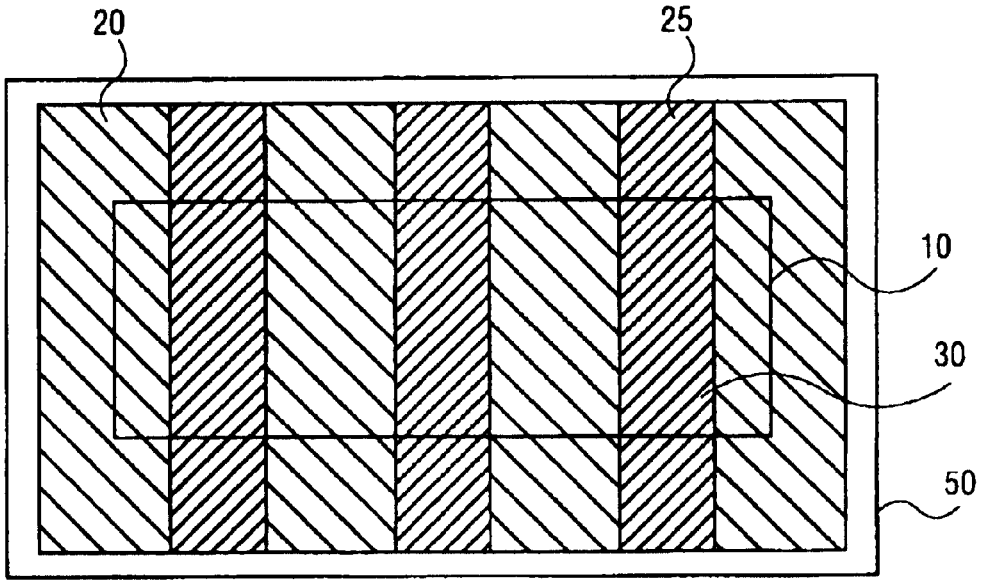
FIG. 4 illustrates a top view of the bonding pad structure.

FIG. 4 illustrates a top view of the integrated circuit device after the bonding pad structure 50 has been formed. The metal array 20 overlie the active circuits 10, while the metal slots 25 expose a portion of the dielectric layer 30.

Figure 5:
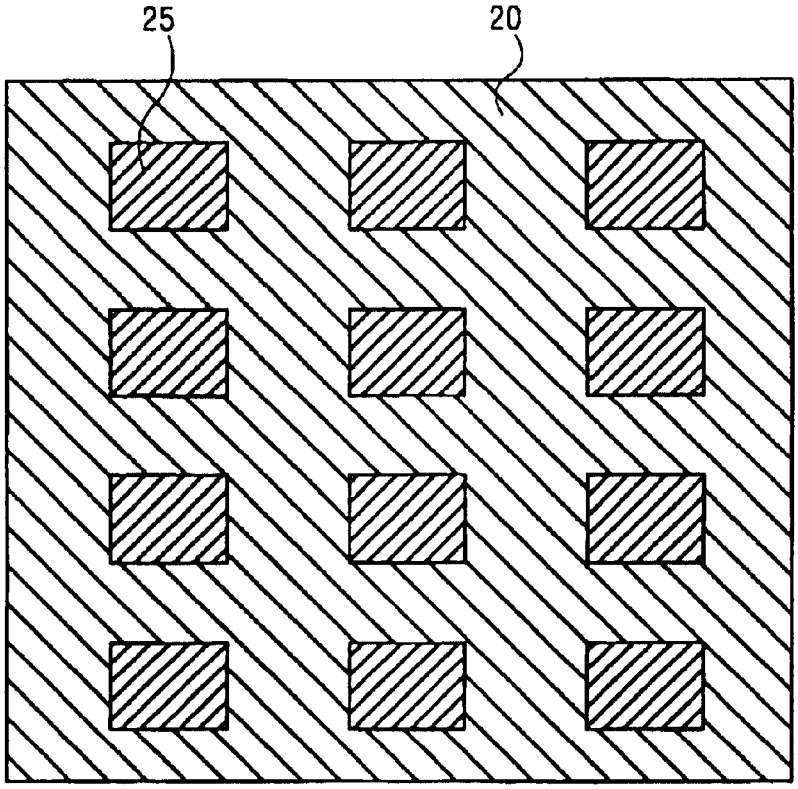
FIG. 5 illustrates a top view of the bonding pad structure where metal openings form a square pattern.

FIG. 5 illustrates another embodiment of the present invention where the uppermost metal layer 20 is etched to form the metal openings 25 consisting of a square pattern. It should be noted that the metal openings 25 in the metal layer 20 may take any polygonal shape, e.g. rectangle, square, circle, triangle, etc. and they may form any shape in the metal layer such as a grid, waffle, slots, etc.

The bonding pad structure protects the underlying active circuits during the process of attaching the bonding wire onto the bonding pad. The bonding pad is subjected to mechanical shock as the bonding tool brings down the wire and exerts pressure or vibration on the bonding pad. Additionally, the bonding pad is subjected to heat in order to achieve a good quality bond.

Figure 6:
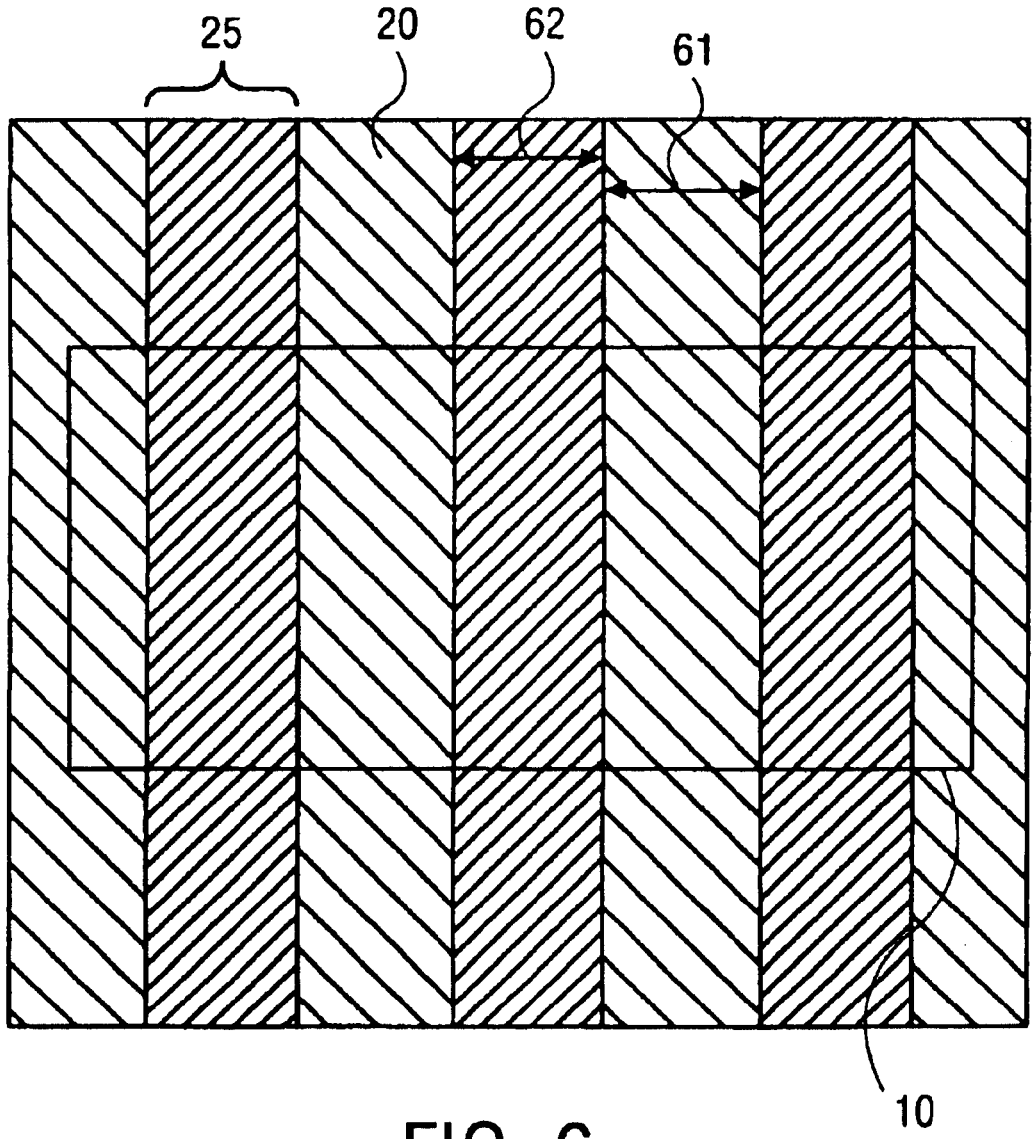
FIG. 6 illustrates a top view of the bonding pad structure according to another embodiment of the present invention.

Slotting the metal layer 20 underlying the bonding pad allows the metal to expand while subjected to mechanical and thermal stresses. In one embodiment of the present invention, the metal layer is etched, as illustrated in FIG. 6, such that the width 61 of the metal array 20 is twice as wide as the width 62 of the metal slots 25. Therefore, the metal expands into the open slot region, relieving the shear and compression stresses that would otherwise be transferred to the active circuits 10 of the device.

One additional advantage of the present invention is that it allows the formation of IC devices with smaller die areas. Typically, a square bonding pad has dimensions of 85 microns to 125 microns. Additionally, prior art IC design rules do not allow the placing of any circuit within 25 microns of a bonding pad. Thus, if the bonding pads are placed on top of active circuits, the bonding pads placement is no longer restricted to just the edges of the die. According to the present invention, the bonding pads can be placed anywhere on the die area. Such a process will reduce the die area by the amount of the combined surface area of each bonding pad and the amount of space required by the design rules.

It should be noted that the method of the present invention may be practiced using many types of active circuits. For example, transistors, resistors, etc., or any combination of active circuits may be placed under the bonding pad structure, according to the present invention.

In one embodiment of the present invention, the bonding pad is formed over electrostatic discharge (ESD) protection circuits. ESD protection circuits protect active devices from destructive static charge build-up due to various transient charge sources such as human or machine handling of the IC chip during processing, assembly, and installation of the chip. The ESD structure would be placed directly underneath the bonding pad structure and approximately in the center of the bond pad area.

Thus, the present invention provides a bonding pad structure for integrated circuit devices which protects the underlying circuits from shear and compressive stresses during bonding processes. The present invention accomplishes a reduction in the chip area and eliminates the parasitic resistance due to long interconnection wires between bonding pads and active regions. Although certain specific embodiments have been described, various modifications and changes to the disclosed embodiments will be apparent to one of ordinary skill in the art upon reading this disclosure. Therefore, it is to be understood that the specifications and drawings are merely illustrative of and not restrictive on the broad invention, and that this invention is not limited to the specific embodiments shown and described.

What is claimed is:

1. A method for forming a bonding pad structure over an active circuit of an integrated circuit device, the method comprising the steps of:

*depositing at least one conductive layer directly over said active circuit,* depositing a metal layer *directly* over said active circuit *after depositing said at least one conductive layer*;

patterning and etching said metal layer to form an array of openings in said metal layer;

depositing a dielectric layer over said metal layer and over said array of openings in said metal layer;

forming one or more vias in said dielectric layer; and forming a bonding pad [that] *directly over said active circuit and said array of openings in said metal layer, wherein said bonding pad* is electrically *and physically* connected to said metal layer *by said one or more vias*.

2. The method as described in claim 1 further comprising [the step of depositing at least one conductive layer over said active circuit, wherein said step of depositing at least one conductive layer is performed prior to said step of depositing said metal layer] *depositing an insulating layer over said at least one conductive layer prior to depositing said metal layer*.

3. The method as described in claim 1 wherein said active circuit is an electrostatic discharge circuit.

4. The method as described in claim 1 wherein said active circuit comprises a circuit selected from the group consisting of: a transistor, a resistor, a capacitor, an inductor, or any combination thereof.

5. The method as described in claim 1 wherein said dielectric layer comprises silicon dioxide.

6. The method as described in claim 1 wherein said bonding pad comprises a material selected from the group consisting of: polysilicon, silicon alloys, aluminum, aluminum alloys, gold, gold alloys, copper, and copper alloys, or any combination thereof.

7. The method as described in claim 1 wherein said metal layer comprises a material selected from the group consisting of: polysilicon, silicon alloys, aluminum, aluminum alloys, copper, and copper alloys, or any combination thereof.

8. The method as described in claim 2 wherein said conductive layer comprises a material selected from the group consisting of: polysilicon, silicon alloys, aluminum, aluminum alloys, copper, and copper alloys, or any combination thereof.

9. The method as described in claim 1 wherein said step of patterning and etching said metal layer forms a conductive region taking the shape of a grid.

10. The method as described in claim 1 wherein said step of patterning and etching said metal layer forms a conductive region taking the shape of a waffle.

11. The method as described in claim 1 wherein said step of patterning and etching said metal layer forms metal slots.

12. The method as described in claim 1 wherein said [bonding pad is connected to said active circuit by a via] *one or more vias are* located along [the] *an* edge of said bonding pad.

13. A method for forming a bonding pad structure over an active circuit of an integrated circuit device, the method comprising the steps of:

depositing a plurality of metal layers *directly* over said active circuit, wherein said plurality of metal layers has an uppermost metal layer;

patterning and etching said uppermost metal layer to form an array of openings in said *uppermost* metal layer;

depositing a dielectric layer over said uppermost metal layer and over said array of openings in said *uppermost* metal layer;

forming one or more vias in said dielectric layer; and forming a bonding pad [that] *directly over said active circuit and said array of openings in said uppermost layer, wherein said bonding pad* is electrically *and physically* connected to said uppermost metal layer *by said one or more vias*.

14. The method as described in claim 13 wherein said active circuit is an electrostatic discharge circuit.

15. The method as described in claim 13 wherein said active circuit comprises a circuit selected from the group consisting of: a transistor, a resistor, a capacitor, an inductor, or any combination thereof.

16. The method as described in claim 13 wherein said dielectric layer comprises silicon dioxide.

17. The method as described in claim 13 wherein said bonding pad comprises a material selected from the group consisting of: polysilicon, silicon alloys, aluminum, aluminum alloys, gold, gold alloys, copper, and copper alloys, or any combination thereof.

18. The method as described in claim 13 wherein said metal layers comprise a material selected from the group consisting of: polysilicon, silicon alloys, aluminum, aluminum alloys, copper, and copper alloys, or any combination thereof.

19. The method as described in claim 13 wherein said step of patterning and etching said uppermost metal layer forms a conductive region taking the shape of a grid.

20. The method as described in claim 13 wherein said step of patterning and etching said uppermost metal layer forms a conductive region taking the shape of a waffle.

21. The method as described in claim 13 wherein said step of patterning and etching said uppermost metal layer forms metal slots.

22. The method as described in claim 13 wherein said bonding pad is connected to said active circuit by a via located along the edge of said bonding pad.

23. A method for forming a bonding pad structure over an active circuit of an integrated circuit device, the method comprising the steps of:

depositing a plurality of metal layers *directly* over said active circuit, wherein said plurality of metal layers has an uppermost metal layer;

patterning and etching said uppermost metal layer to form an array of openings in said *uppermost* metal layer;

depositing a dielectric layer over said uppermost metal layer and over said array of openings in said *uppermost* metal layer;

forming one or more vias in said dielectric layer; and forming a bonding pad *directly over said active circuit and said array of openings in said uppermost metal layer*, wherein said bonding pad is connected to said active circuit and said uppermost metal layer by vias located along the edge of said bonding pad.

24. The method as described in claim 23 wherein said active circuit is an electrostatic discharge circuit.

25. The method as described in claim 23 wherein said active circuit comprises a circuit selected from the group consisting of: a transistor, a resistor, a capacitor, an inductor, or any combination thereof.

26. The method as described in claim 23 wherein said dielectric layer comprises silicon dioxide.

27. The method as described in claim 23 wherein said bonding pad comprises a material selected from the group consisting of: polysilicon, silicon alloys, aluminum, aluminum alloys, gold, gold alloys, copper, and copper alloys, or any combination thereof.

28. The method as described in claim 23 wherein said metal layers comprise a material selected from the group consisting of: polysilicon, silicon alloys, aluminum, aluminum alloys, copper, and copper alloys, or any combination thereof.

29. The method as described in claim 23 wherein said step of patterning and etching said uppermost metal layer forms a conductive region taking the shape of a grid.

30. The method as described in claim 23 wherein said step of patterning and etching said uppermost metal layer forms a conductive region taking the shape of a waffle.

31. The method as described in claim 23 wherein said step of patterning and etching said uppermost metal layer forms metal slots.

*32. A bonding pad structure over an active circuit of an integrated circuit device comprising:*

*a plurality of metal layers directly over said active circuit, wherein said plurality of metal layers has an uppermost metal layer having an array of openings directly over said active circuit;*

*a bonding pad positioned directly over said active circuit and said array of openings;*

*an insulating layer positioned between said uppermost metal layer and said bonding pad; and*

*a via formed in said insulating layer physically connecting said uppermost metal layer and said bonding pad.*

*33. The bonding pad structure of claim 32 wherein said insulating layer is formed of silicon dioxide.*

*34. The bonding pad structure of claim 32 wherein said uppermost metal layer having an array of openings takes on the shape of a waffle.*

*35. The bonding pad structure of claim 32 wherein said uppermost metal layer is formed from a material selected from the group consisting of: polysilicon, silicon alloys, aluminum, aluminum alloys, gold, gold alloys, copper, and copper alloys, or any combination thereof.*

*36. The bonding pad structure of claim 32 wherein said via is located along an edge of said bonding pad.*

*37. The bonding pad structure of claim 32 wherein said active circuit comprises a circuit selected from the group consisting of: a transistor, a resistor, a capacitor, an inductor, or any combination thereof.*

*38. The bonding pad structure of claim 32 wherein said active circuit is an electrostatic discharge protection circuit.*

*39. The bonding pad structure of claim 32 wherein said active circuit is formed on a substrate.*

*40. A bonding pad structure comprising:*

*an active circuit;*

*a first insulating layer formed over said active circuit;*

*a plurality of metal layers directly over said active circuit, wherein said plurality of metal layers has an uppermost layer having an array of openings;*

*a second insulation layer formed over said uppermost metal layer;*

*a bonding pad formed directly over said active circuit and said array of openings; and*

*a via formed in said second insulating layer physically connecting said bonding pad and said uppermost metal layer.*

*41. The bonding pad structure of claim 40 wherein said uppermost metal layer comprises a material selected from the group consisting of: polysilicon, silicon alloys, aluminum, aluminum allows, gold, gold alloys, copper, and copper alloys or any combination thereof.*

*42. The bonding pad structure of claim 41 wherein said bonding pad comprises a material selected from the group consisting of: polysilicon, silicon alloys, aluminum, aluminum allows, gold, gold alloys, copper, and copper alloys or any combination thereof.*

*43. The bonding pad structure of claim 41 wherein said active circuit comprises a circuit selected from the group consisting of: a transistor, a resistor, a capacitor, an inductor, or any combination thereof.*

*44. The bonding pad structure of claim 43 wherein said uppermost metal layer having an array of openings forms a conductive region taking the shape of a waffle.*

*45. The bonding pad structure of claim 40 wherein said uppermost metal layer and said active circuit are in electrical communication through a via.*

*46. The bonding pad structure of claim 45 wherein said active circuit is an electrostatic discharge circuit.*

*47. The bonding pad structure of claim 40 wherein said first insulating layer and said second insulating layer comprises silicon dioxide.*

*48. The bonding pad structure of claim 40 wherein said array of openings forms slots in said uppermost metal layer.*

*49. A bonding pad structure comprising:*

*a substrate layer having an active circuit;*

*a bonding pad positioned directly over said active circuit;*

*an intermediary layer having a plurality of metal layers and a plurality of insulating layers directly over said active circuit, each one of said plurality of metal layers covered by one of said plurality of insulating layers, at least one of said plurality of metal layers containing an array of openings that form a grid and being in electrical and physical contact with said bonding pad through a via.*

*50. The bonding pad structure of claim 49 wherein said plurality of metal layers comprise a material selected from the group consisting of: polysilicon, silicon alloys, aluminum, aluminum alloys, gold alloys, copper, and copper alloys or any combination thereof.*

*51. The bonding pad structure of claim 50 wherein said active circuit comprises a circuit selected from the group consisting of: a transistor, a resistor, a capacitor, an inductor, or any combination thereof.*

*52. The bonding pad structure of claim 49 wherein said active circuit is an electrostatic discharge circuit.*

*53. A method for forming a bonding pad structure comprising the steps of:*

*forming a plurality of metal layers directly over an active circuit, wherein said plurality of metal layers includes an uppermost metal layer having an array of openings;*

*forming a dielectric layer over said uppermost metal layer;*

*forming a via in said dielectric layer; and*

*forming a bonding pad that is electrically and physically connected to said uppermost metal layer by said via, said bonding pad positioned directly over said active circuit and said array of openings.*

*54. The method of claim 53 wherein said active circuit is an electrostatic discharge unit.*

*55. The method of claim 53 wherein said active circuit comprises a circuit selected from the group consisting of: a transistor, a resistor, a capacitor, an inductor, or any combination thereof.*

*56. The method of claim 53 wherein forming said array of openings in said uppermost metal layer forms a conductive region taking the shape of a waffle.*

*57. The method of claim 53 wherein said dielectric layer comprises of silicon dioxide.*

*58. The method of claim 57 wherein forming said array of openings in said uppermost metal layer forms a conductive region taking the shape of a grid.*

*59. The method of claim 53 wherein said uppermost metal layer is formed from a material selected from the group consisting of: polysilicon, silicon alloys, aluminum, aluminum alloys, gold, gold alloys, copper, and copper alloys, or any combination thereof.*

*60. The method of claim 53 wherein said active circuit is formed on a substrate.*

*61. The method of claim 60 wherein forming said array of openings in said uppermost metal layer forms a conductive region having rows and columns of openings.*

* * * * *